US008127216B2

(12) United States Patent
Xu et al.

(10) Patent No.: US 8,127,216 B2
(45) Date of Patent: Feb. 28, 2012

(54) REDUCED STATE SOFT OUTPUT PROCESSING

(75) Inventors: GuoFang Xu, Longmont, CO (US);
Michael John Link, St. Paul, MN (US);
William Michael Radich, Chaska, MN (US)

(73) Assignee: Seagate Technology LLC, Cupertino, CA (US)

( * ) Notice: Subject to any disclaimer, the term of this patent is extended or adjusted under 35 U.S.C. 154(b) by 1108 days.

(21) Appl. No.: 11/942,515

(22) Filed: Nov. 19, 2007

(65) Prior Publication Data
US 2009/0132897 A1 May 21, 2009

(51) Int. Cl.
*H03M 13/03* (2006.01)
(52) U.S. Cl. .................. 714/796; 714/795; 714/755
(58) Field of Classification Search .................. 714/796, 714/794, 795, 755
See application file for complete search history.

(56) References Cited

U.S. PATENT DOCUMENTS

| | | | |
|---|---|---|---|
| 5,457,704 A | 10/1995 | Hoeher et al. ................ 371/43 |
| 5,537,444 A | 7/1996 | Nill et al. ...................... 375/341 |
| 5,841,796 A | 11/1998 | Snyder, Jr. .................... 371/43.6 |
| 5,938,790 A | 8/1999 | Marrow ........................ 714/795 |
| 5,970,098 A | 10/1999 | Herzberg ....................... 375/264 |
| 5,996,104 A | 11/1999 | Herzberg ....................... 714/755 |
| 6,145,114 A | 11/2000 | Crozier et al. ................ 714/794 |
| 6,167,552 A | 12/2000 | Gagnon et al. ................ 714/793 |
| 6,182,261 B1 | 1/2001 | Haller et al. .................. 714/758 |
| 6,185,716 B1 | 2/2001 | Riggle .......................... 714/769 |
| 6,272,183 B1 | 8/2001 | Berens et al. ................. 375/262 |
| 6,292,918 B1 | 9/2001 | Sindhushayana et al. ..... 714/755 |
| 6,370,201 B1 | 4/2002 | Abbaszadeh et al. ......... 375/262 |
| 6,393,076 B1 | 5/2002 | Dinc et al. .................... 375/341 |
| 6,434,719 B1 | 8/2002 | Livingston ................... 714/804 |
| 6,445,755 B1 | 9/2002 | Chung et al. ................. 375/341 |
| 6,470,047 B1 | 10/2002 | Kleinerman et al. ......... 375/350 |
| 6,510,536 B1 * | 1/2003 | Crozier et al. ................ 714/755 |
| 6,529,559 B2 | 3/2003 | Reshef .......................... 375/262 |
| 6,553,536 B1 | 4/2003 | Hassner et al. ............... 714/780 |
| 6,571,366 B1 | 5/2003 | Doetsch et al. ............... 714/751 |
| 6,581,181 B1 | 6/2003 | Sonu ............................ 714/795 |
| 6,581,182 B1 | 6/2003 | Lee .............................. 714/795 |
| 6,587,987 B1 | 7/2003 | Vasic et al. ................... 714/780 |
| 6,606,725 B1 | 8/2003 | Wang et al. .................. 714/755 |
| 6,625,179 B1 | 9/2003 | Doetsch et al. ............... 370/529 |
| 6,629,286 B1 | 9/2003 | Berens et al. ................ 714/755 |
| 6,658,071 B1 | 12/2003 | Cheng .......................... 375/348 |
| 6,671,852 B1 | 12/2003 | Ariel et al. ................... 714/793 |
| 6,678,857 B2 | 1/2004 | Sindhushayana et al. ..... 714/755 |
| 6,694,477 B1 | 2/2004 | Lee .............................. 714/784 |

(Continued)

OTHER PUBLICATIONS

Jongseung Park and Jackyun Moon, "A New Soft-Output Detection Method for the Magnetic Recording Channel," IEEE Global Telecommunications Conference, 2001, V. 5, pp. 3002-3006.

(Continued)

*Primary Examiner* — Fritz Alphonse
(74) *Attorney, Agent, or Firm* — Kirk A. Cesari; Cesari & Reed LLP

(57) ABSTRACT

Devices, methods, and systems of a communications channel detector are disclosed that can compare a plurality of candidate sequences of bits and decisions to identify unlikely error events. The detector may then discard at least one candidate sequence based on an unlikely error event to produce a set of remaining paths. A branch metric calculator may be adapted to calculate metrics for a set of remaining paths.

20 Claims, 5 Drawing Sheets

U.S. PATENT DOCUMENTS

| | | | |
|---|---|---|---|
| 6,697,441 B1 | 2/2004 | Bottomley et al. | 375/340 |
| 6,697,443 B1 | 2/2004 | Kim et al. | 375/341 |
| 6,708,308 B2 | 3/2004 | DeSouza et al. | 714/795 |
| 6,731,700 B1 | 5/2004 | Yakhnich et al. | 375/341 |
| 6,738,948 B2 | 5/2004 | Dinc et al. | 714/794 |
| 6,772,389 B2 | 8/2004 | Kim et al. | 714/780 |
| 6,785,861 B2 | 8/2004 | Scalise et al. | 714/786 |
| 6,791,995 B1 | 9/2004 | Azenkot et al. | 370/486 |
| 6,810,095 B2 | 10/2004 | Naitou | 375/341 |
| 6,862,326 B1 | 3/2005 | Eran et al. | 375/343 |
| 6,865,711 B2 | 3/2005 | Arad et al. | 714/796 |
| 6,885,711 B2 | 4/2005 | Shiu et al. | 375/340 |
| 6,901,103 B2 | 5/2005 | Jayaraman et al. | 375/130 |
| 7,096,412 B2 * | 8/2006 | Chen et al. | 714/794 |
| 7,114,122 B2 | 9/2006 | Shih | 714/795 |
| 7,765,458 B1 * | 7/2010 | Yang et al. | 714/795 |
| 2006/0067434 A1 | 3/2006 | Kovintavewat et al. | 375/340 |
| 2006/0265634 A1 | 11/2006 | Silvus et al. | 714/784 |
| 2006/0282712 A1 | 12/2006 | Argon et al. | 714/701 |
| 2006/0282753 A1 | 12/2006 | Vasiliev | 714/794 |
| 2007/0033508 A1 | 2/2007 | Hekstra et al. | 714/795 |
| 2007/0180352 A1 | 8/2007 | Amer | 714/795 |

OTHER PUBLICATIONS

Jun Shi and Richard Wesel, "Further Error Event Diagram Reduction Using Algorithmic Techniques," IEEE International Conference on Communications, 2003, v. 4, pp. 2822-2826.

* cited by examiner

REDUCED STATE SOFT OUTPUT PROCESSING

BACKGROUND

The present disclosure relates to data channels and more particularly those that utilize soft output viterbi algorithms (SOVA).

In communication channels, data must be transmitted through the channel reliably. Data is represented as a sequence of bits, which each bit taking a value of zero or one. In most communication channels, two major components ensure the reliability of the data: a detection channel (or detector) and an error correction code (ECC). The detector receives an analog waveform from the channel, converts the analog waveform to a digital waveform, and then converts the digital waveform into ones and zeros. The ones and zeros are grouped in a contiguous subsequence of bits known as symbol. The number of bits in a symbol is determined as a parameter of the ECC and is typically a small number, such as ten. The data symbols are transmitted to an ECC decoder, where erroneous symbols are corrected, assuming that the number of symbols that the ECC has been designed to correct has not been exceeded.

In some instances, the detector utilizes an algorithm such as a SOVA in identifying reliability data to the analog waveform information that is received. This reliability information is known as "soft" information and can be processed to determine signals sent in the analog waveform. A trellis can be traversed using the SOVA and calculations for traversing various paths can be made to determine a most likely path.

SUMMARY

An approach to reducing processing of soft output is disclosed. Candidate sequences of bits can be comprised to soft output decisions to reduce at least one of the candidate sequences. Branch metric calculations can be performed for remaining candidate sequences and a most likely path can be selected from the remaining candidate sequences.

In one aspect, a channel detector for receiving a signal from a channel medium is discussed. The channel detector includes a path generator adapted to produce a plurality of candidate sequences of bits and decisions regarding logic states of the detected bits in output signal based on reliability information for the logic states. The channel detector also includes a state reducer for comparing the plurality of candidate sequences of bits and the decisions and reduces at least one candidate sequence based on the comparison to produce a set of remaining paths. A branch metric calculator calculates metrics for the set of remaining paths.

A method of decoding a signal received from a channel is also disclosed that includes detecting bits in the signal and generating a plurality of candidate sequences of bits therefrom. Reliability information regarding logic states of detected bits in the signal is determined and decisions regarding the logic states are generated based on the reliability information. The decisions and the plurality of candidate sequences are compared and at least one of the plurality of candidate sequences are reduced based on the comparison to form a set of remaining candidate sequences. A branch metric calculation is then performed on the set of remaining candidate sequences.

In another aspect, a communications channel is disclosed that includes a channel medium. A channel detector is adapted to receive a signal from the channel medium and includes a path generator adapted to produce a plurality of candidate sequences of bits and decisions regarding logic states of the detected bits in the output signal based on reliability information for the logic states. The detector also includes a state reducer for comparing the plurality of candidate sequences of bits and the decisions and reducing at least one candidate sequence based on the comparison to produce a set of remaining paths. A branch metric calculator calculates metrics for the set of remaining paths.

Other features and benefits that characterize embodiments of the present invention will be apparent upon reading the following detailed description and review of the associated drawings.

DETAILED DESCRIPTION

Figure 1:
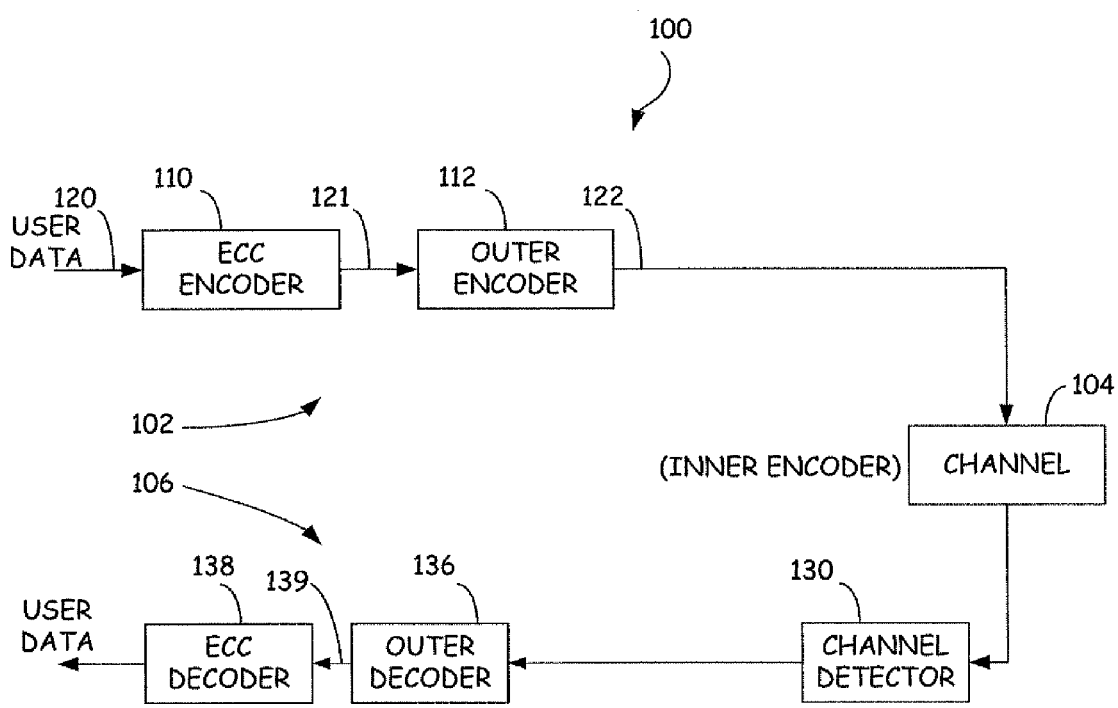
FIG. 1 is a block diagram illustrating a communications system.

FIG. 1 is a block diagram illustrating communications system 100. System 100 can correspond to any communication channel through which data is transmitted or received, such as satellite, cellular and storage channels.

System 100 includes a transmit path 102, a channel 104 and a receive path 106. In the case of a data storage channel, transmit path 102 corresponds to a write path, receive path 106 corresponds to a read path, and channel 104 corresponds to a storage device, such as a hard disc or other memory device. Transmit path 102 includes an ECC encoder 110 and outer encoder 112. ECC encoder 110 receives a sequence of user data words 120 and produces corresponding multiple-bit ECC symbols 121. ECC encoder 110 can operate on any number of user data bits, such as individual user data words or an entire data sector. In one embodiment, ECC encoder 110 operates on a data sector.

A simple ECC code is based on parity. A parity bit is added to a group of data bits, such as a data word, and has a logic state that is selected to make the total number of ones (or zeros) in the data word either even or odd. The original data word is then passed to outer encoder 112 along with the additional parity bit as a modified data word or "ECC symbol" 121. In receive path 106, the parity of the ECC symbol can be checked against an expected value. If the parity is correct, the receiver path assumes there are no bit errors. If the parity is incorrect, the receiver path assumes there is an error in the transmitted data.

More complex ECC codes can also be used for enabling not only detection of additional errors but also correction of some of the detected errors. For example, a single-error correction, double-error detection (SEC-DED) Hamming code adds enough additional parity bits to enable the detection circuit to detect and correct any single-bit error in a data word and detect two-bit errors. Other types of error correction codes include convolution (tree) codes and block codes. In these types of ECC codes, one or more data words are divided into blocks of data, and each block of data is encoded into a longer block of data known as an ECC symbol, as mentioned above. With convolution codes, the encoding of one block of data depends on the state of the encoder as well as the data to be encoded. Reed Solomon ECC codes correct symbols (groups of bits), not bits. In one embodiment, ECC encoder 110 implements a Reed Solomon Code, and each ECC symbol 121 includes one or more data bits and one or more ECC parity bits. The ECC parity bits can be concatenated to the data bits, distributed among the data bits or encoded with the data bits.

Outer encoder 112 encodes the data to encoded symbols 122 before the data is transmitted to channel 104. Outer encoder 112 can implement any suitable type of code, such as a block code, a convolution code, a Low Density Parity Check (LDPC) code, single parity check (SPC), turbo code, or a Turbo-Product Code (TPC) to add outer parity bits, for example, to the ECC symbol 121. In one embodiment, outer encoder 112 implements a TPC code, which generates a multi-dimensional array of code words using linear block codes, such as parity check codes, Hamming codes, BCH codes, etc. The simplest type of TPC code is a two-dimensional TPC single parity check (TPC/SPC) with a single parity bit per row and column. A TPC with a multiple parity check (TPC/MPC) is similar to a TPC/SPC code with the exception that there are multiple row parity bits and multiple column parity bits. The multiple parity bits provide more flexibility in code structure, code rate and code length.

The input end of channel 104 can include elements such as a precoder, a modulator, etc. The output end of channel 104 can include elements such as a preamplifier, a timing circuit, an equalizer and others. In the case of a magnetic recording channel, the read/write process and equalization act as an inner encoder. However, channel 104 can include any other media, such as a twisted pair, optical fiber, satellite, cellular or any other wired or wireless digital or analog communication system.

Receiver path 106 includes a channel detector 130, an outer decoder 136 and an ECC decoder 138. At the input side of channel detector 130, the analog waveform received from channel 104 is equalized and sampled to form a digital waveform of detected bits. Channel detector 130 and outer decoder 136 then convert the digital waveform into ones and zeros. The ones and zeros are grouped into contiguous subsequences of bits known as symbols. The number of bits in a symbol is determined as a parameter of the ECC encoder 110 used in transmit path 102. The number of bits in a symbol is typically a small number such as ten. The ECC symbols are then transmitted to the ECC decoder 138, which detects and/ or corrects any erroneous symbol that has not been corrected by channel detector 130, post processor 132 and outer decoder 136, assuming that the number of erroneous symbols does not exceed the number of symbols that the ECC code has been designed to correct.

Channel detector 130 generates a plurality of candidate sequences of bits based on the digital waveform. A dynamic programming algorithm, such as the Viterbi algorithm, can be used to decode the plurality of candidate sequences to evaluate the candidate sequences. In addition, channel detector 130 can include any type of "soft decoder", which produces quality "soft" (or reliability) information about each bit decision it makes. For example, channel detector 130 can include a Soft-Output Viterbi Algorithm (SOVA) detector or a Bahl, Cocke, Jelinek and Ravive (BCJR) algorithm detector. In this embodiment, channel detector 130 is described as being a SOVA detector with an outer decoder 136. However, it is to be understood that these are implemented-specific and can be replaced by other blocks that accomplish the same goals of detecting the data and producing soft (reliability) information and of processing of the data to resolve the parity of the outer code.

For each bit position "u" in the received digital waveform, channel detector 130 makes a soft decision, which can be expressed in terms of a log-likelihood ratio (LLR), for example, which can be defined based on the probability ratio $\lambda = Pr\{u=1\}/Pr\{u=0\}$ as $LLR(u) = \log \lambda$. The LLR represents the probability or confidence that the bit position is either a logic one or a zero. In some applications, it is more convenient to use $\log \lambda$ as a soft decision. The LLR ratio for each bit position can be expressed in terms of a signed number. For example, the signed numbers can range from +10 to −10. The sign of the number represents the likely state of the bit, with a "+" representing a logic one and a "−" representing a logic zero. The magnitude of the number represents the degree of confidence channel detector 130 has in the particular state. For example, a +1 can indicate that the bit might be a logic 1, but it's not sure. A +5 can indicate that the bit is probably a logic one and a +10 can represent that the bit is almost certainly logic one. Whereas, a −4 may reflect that the bit is probably a logic zero.

Channel detector 130 makes hard decisions as to the logic status for each bit position based on the soft information. The channel detector 130 then uses the hard decisions and the plurality of candidate sequences from the digital waveform from channel detector 130 to reduce a number of candidate sequences of bits from channel detector 130. For example, a binary "exclusive or" operation can be used to compare the hard decisions and the candidate sequences. Based on the comparisons, certain error events can be detected and unlikely error events can be removed in order to reduce the amount of decoding necessary by outer decoder 136.

Outer decoder 136 decodes the outer code implemented by outer encoder 112 and provides corresponding decoded symbols 139. ECC encoder 138 receives the symbols generated by outer decoder 136 and decodes the symbols into corresponding user data words. The ECC code implemented by ECC encoder 110 allows ECC decoder 138 to detect and/or correct erroneous symbols, assuming the number of symbols that the ECC has been designed to correct has not been exceeded.

In addition to system 100, a channel detector can be used to compare hard decisions and candidate sequences in a system that uses an iterative decoding method. The method is called "iterative" (or "turbo") decoding, because the data is processed multiple times in the detector. In an iterative decoder, special coding (parity and interleaving are two of several options) is introduced before the data is transmitted to the channel. When the data is received from the channel, the data runs through a "soft decoder", which produces quality "soft" information about each bit decision it makes.

The soft decisions are transferred to a block that resolves the parity based on the hard and soft information. This step is often implemented with a technique called "message passing." Once the message passing is complete, both the soft and hard information have been altered and hopefully improved. This updated information is passed back to the soft decoder where the signal is detected again. Finally, the hard and soft detector output is sent back to the parity resolver, where the hard and soft information is once again improved. This iteration process may continue any number of times. Practically, the number of iterations is limited by the time that system has to deliver the data to the user. The result is an increased confidence or reliability of the detected data.

In a communication channel having an iterative-type of decoding system, two domains exist: a code or parity domain, in which error correction codes (ECC) are added to the user data bits, and a channel or detector domain in which the bits of the user data words and the ECC codes are interleaved (re-ordered) with one another.

Figure 2:
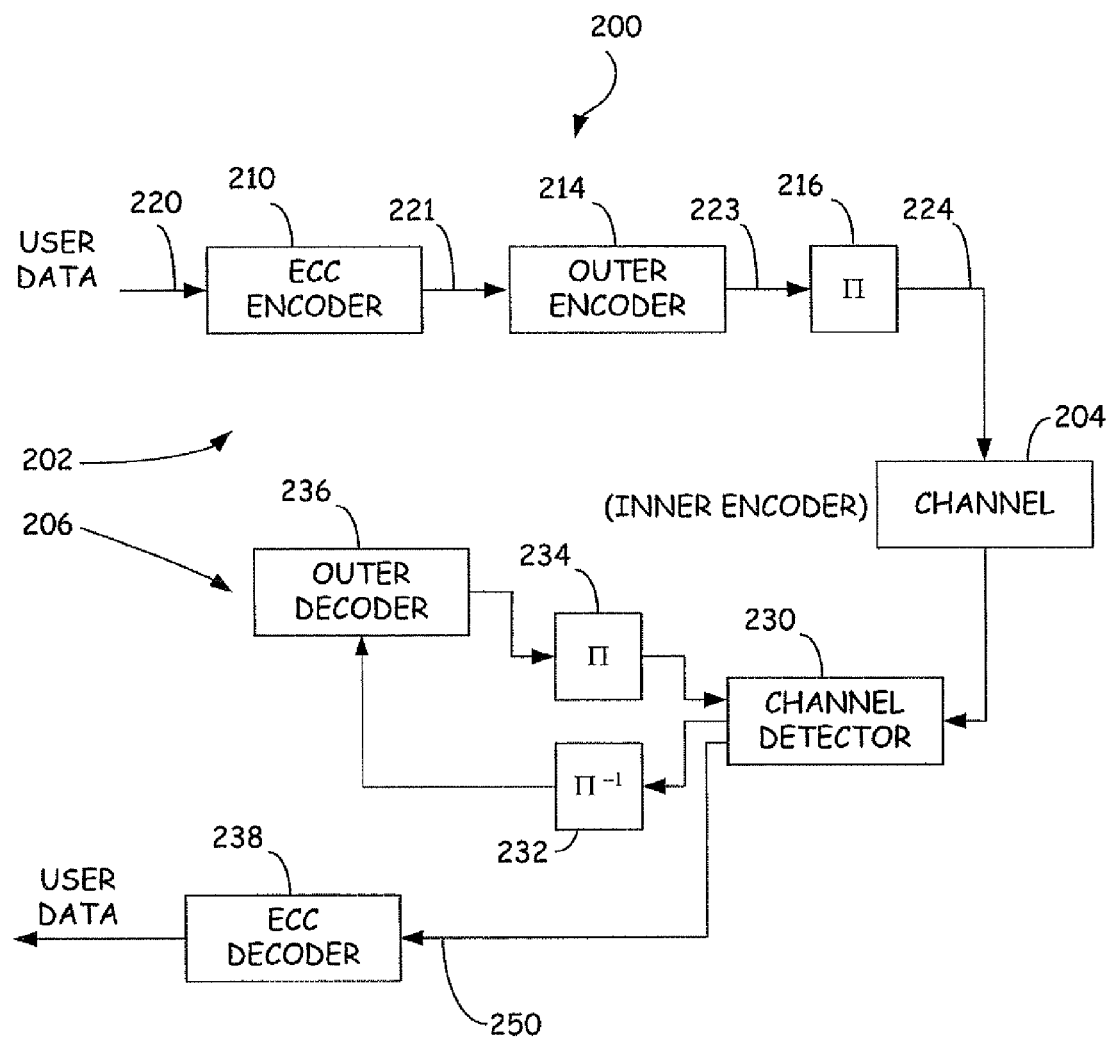
FIG. 2 is a block diagram of an iterative communications system.

FIG. 2 is a block diagram illustrating an iterative encoding/decoding system 200. System 200 can correspond to any communication channel through which data is transmitted or received, such as satellite, cellular and storage channels.

System 200 includes a transmit path 202, a channel 204 and a receive path 206. In the case of a data storage channel, transmit path 202 corresponds to a write path, receive path 206 corresponds to a read path, and channel 204 corresponds to a storage device, such as a hard disc or other memory device. Transmit path 202 includes an ECC encoder 210, outer encoder 214 and interleaver 216. ECC encoder 210 receives a sequence of user data words 220 and produces corresponding multiple-bit ECC symbols 221. ECC encoder 210 can operate similar to ECC encoder 110 in FIG. 1.

ECC encoder generates ECC symbols 221 and transmits the symbols to outer encoder 214 as discussed above with respect to ECC encoder 110. Outer encoder further produces code words 223 as discussed above with respect to outer encoder 112. The code words 223 produced by outer encoder 214 are passed through interleaver 216, which shuffles the bits in code words 223 in a pseudo-random fashion to produce interleaved code words 224 for transmission through channel 204.

The input end of channel 204 can include elements such as a precoder, a modulator, etc. The output end of channel 204 can include elements such as a preamplifier, a timing circuit, an equalizer and others. In the case of a magnetic recording channel, the read/write process and equalization act as an inner encoder. However, channel 204 can include any other media, such as a twisted pair, optical fiber, satellite, cellular or any other wired or wireless digital or analog communication system.

Receiver path 206 includes a channel detector 230, a de-interleaver 232, an interleaver 234, an outer decoder 236 and an ECC decoder 238. At the input side of channel detector 230, the analog waveform received from channel 204 is equalized and sampled to form a digital waveform of detected bits. Channel detector 230 and outer decoder 236 then convert the digital waveform into ones and zeros. The ones and zeros are grouped into contiguous subsequences of bits known as symbols. The number of bits in a symbol is determined as a parameter of the ECC encoder 210 used in transmit path 202. The number of bits in a symbol is typically a small number such as ten. The ECC symbols are then transmitted to the ECC decoder 238, which detects and/or corrects any erroneous symbol that has not been corrected by channel detector 230 and outer decoder 236, assuming that the number of erroneous symbols does not exceed the number of symbols that the ECC code has been designed to correct.

As discussed above with respect to channel detector 130, channel detector 230 can generate a plurality of candidate sequences from the digital waveform. Additionally, channel detector 230 can include any type of "soft decoder", which produces quality "soft" information about each bit decision it makes. For example, channel detector 230 can include a Soft-Output Viterbi Algorithm (SOVA) detector or a Bahl, Cocke, Jelinek and Ravive (BCJR) algorithm detector. In this embodiment, channel detector 230 is described as being a SOVA detector with an outer decoder 236. However, it is to be understood that these are implemented-specific and can be replaced by other blocks that accomplish the same goals of detecting the data and producing soft (reliability) information and of processing of the data to resolve the parity of the outer code.

For each bit position "u" in the received digital waveform, channel detector 230 makes a soft decision, which can be expressed in terms of a log-likelihood ratio (LLR), for example, which can be defined based on the probability ratio $\lambda=Pr\{u=1\}/Pr\{u=0\}$ as $LLR(u)=\log \lambda$. The LLR represents the probability or confidence that the bit position is either a logic one or a zero. In some applications, it is more convenient to use $\log \lambda$ as a soft decision. The LLR ratio for each bit position can be expressed in terms of a signed number. For example, the signed numbers can range from +10 to −10. The sign of the number represents the likely state of the bit, with a "+" representing a logic one and a "−" representing a logic zero. The magnitude of the number represents the degree of confidence channel detector 230 has in the particular state. For example, a +1 can indicate that the bit might be a logic 1, but it's not sure. A +5 can indicate that the bit is probably a logic one and a +10 can represent that the bit is almost certainly logic one. Whereas, a −4 may reflect that the bit is probably a logic zero.

Channel detector 230 makes soft decisions regarding logic states of detected bits based on the reliability information encoded by outer encoder 214. Based on the soft information and the candidate sequences from the digital waveform, channel detector 230 reduces a number of candidate sequences of bits from channel detector 230. For example, an "exclusive or" operation between the detected bits and the soft decisions of channel detector 230. This operation can identify error events that are unlikely in channel detector 230 and thus candidate sequences associated with these events can be discarded. The bit positions in the sequence at the output of channel detector 230 are in the order that the bit positions were transmitted through channel 204.

De-interleaver 232 re-arranges the bit positions to place the bits (soft information) in the order in which they were originally. Outer decoder 236 resolves the corresponding outer parity bits for each code word or set of code words. Outer decoder 236 decodes the outer code implemented by outer encoder 214 and, based on the results of the parity checks generates altered (hopefully improved) soft information as to the confidence or reliability of each bit decision. The soft decisions produced by outer decoder 236 are generated with a technique called "message passing." For example, outer decoder 236 can upgrade or degrade the soft information depending on whether the outer parity bits match or do not match the corresponding data in the code word. The soft information can be degraded by altering the binary reliability information value from reliable to unreliable. The soft information can be upgraded by altering the binary reliability information from unreliable to reliable.

Once the message passing algorithm is complete, the updated soft information is passed back to channel detector 230 through interleaver 234. Interleaver 234 reorders the soft information back into the bit order of the channel domain. Channel detector 230 uses the updated soft information provided by outer decoder 236 as extrinsic information and again detects the signal received from channel 204 to produce further updated soft bit decisions. These soft bit decisions are again passed to outer decoder 236 and de-interleaver 232. This iteration process may continue any number of times. When the iteration process is complete, channel detector 230 makes hard decisions as to the logic states of each bit position based on the binary reliability information and provides symbols 250 to ECC decoder 238.

ECC decoder 238 receives the hard decisions 250 generated by channel detector 230 and decodes the hard decisions into corresponding user data words. The ECC code implemented by ECC encoder 210 allows ECC decoder 238 to detect and/or correct erroneous symbols, assuming the number of symbols that the ECC has been designed to correct has not been exceeded.

Figure 3:
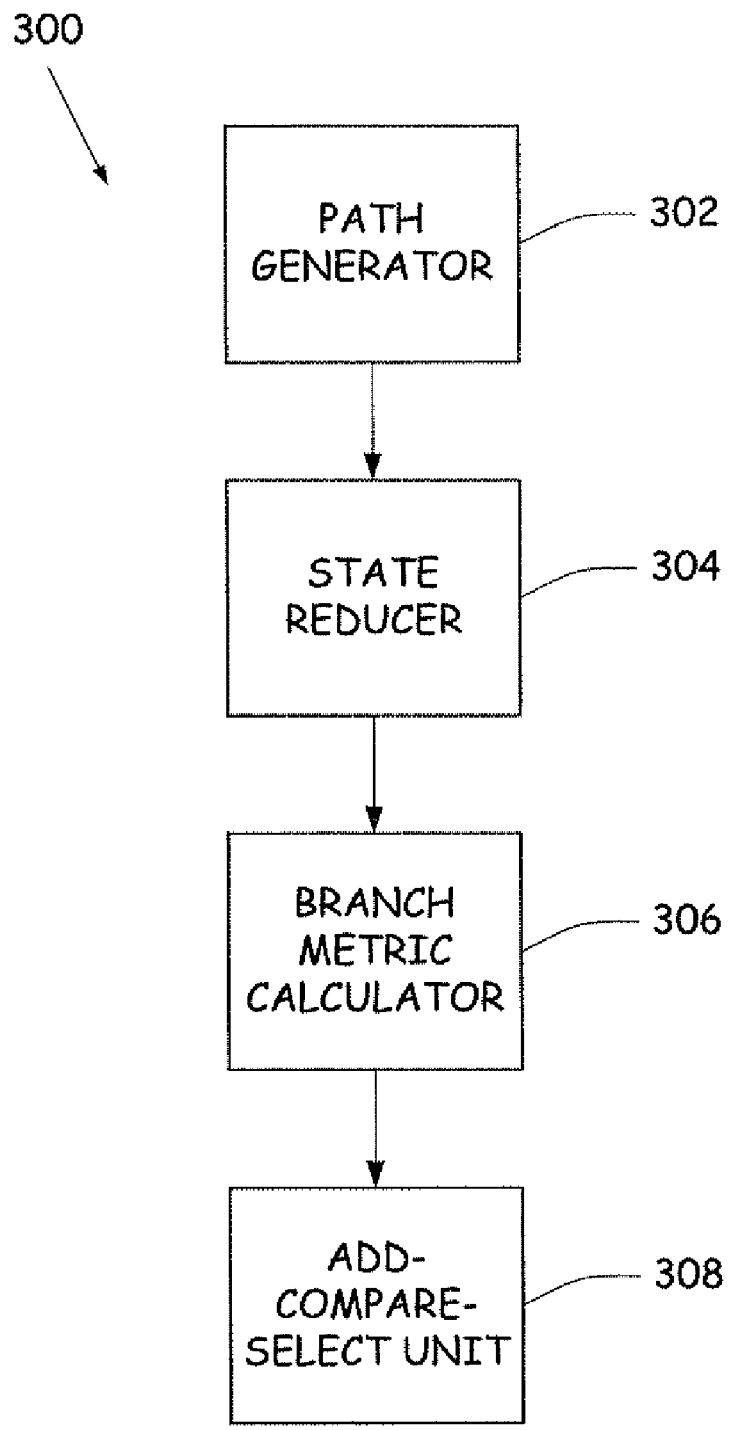
FIG. 3 is a block diagram of a channel detector.

FIG. 3 is a block diagram of a channel detector 300 that can be implemented as channel detector 130 and 230 in FIGS. 1 and 2 described above. Channel detector 300 includes a path generator 302, a state reducer 304, a branch metric calculation unit 306 and an Add-Comparison-Selection (ACS) unit 308. Path generator 302 generates paths in a trellis from bits detected from the channel. In one embodiment, as discussed below, trellis paths can be generated as an error state compared with a primary decision. In this manner, certain error events can be identified as being more likely depending upon particular characteristics of a channel utilizing channel detector 300. State reducer 304 can remove unlikely paths generated by path generator 302 if the paths contain unlikely error events. Remaining paths are sent to branch metric calculator 306 such that branch metric calculations for the paths can be made. ACS unit 308 can then select the most likely path depending on the branch metric calculations.

Figure 4:
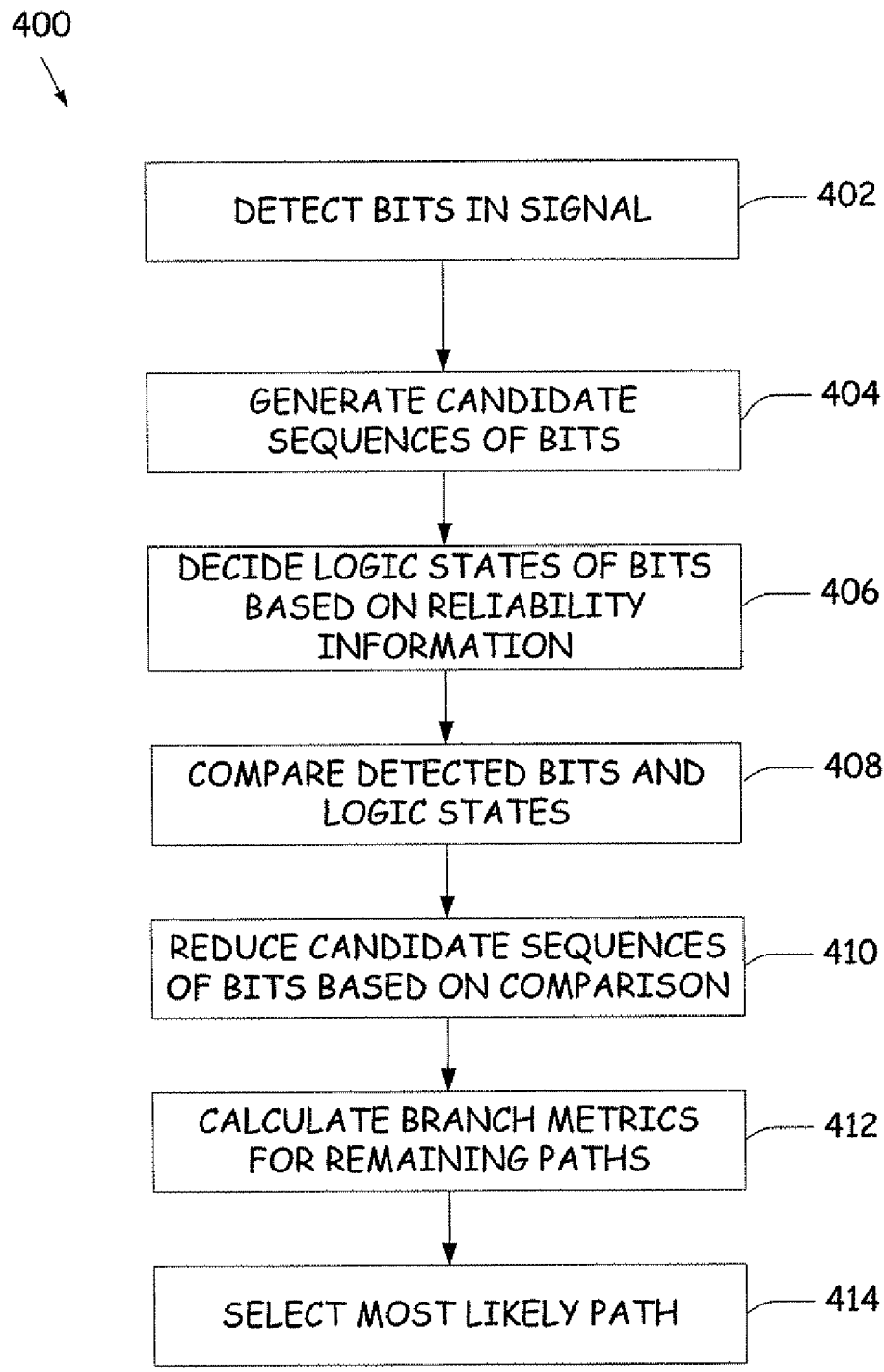
FIG. 4 is a flow chart of a method for reducing candidate sequences of bits of a signal.

FIG. 4 is a method 400 for reducing candidate sequences of bits in a channel that can be performed by channel detector 300. Method 400 begins at step 402, wherein bits in a signal from a channel are detected. For example, channel detector 130 and channel detector 230 can respectively detect bits from channel 104 and channel 204. At step 404, a plurality of candidate sequences of bits are generated based on the detected bits, for example by path generator 302. Logic states of the detected bits are decided based on reliability information at step 406. At step 408, the candidate sequences and the logic states are compared. For example, the comparison can be based on an "exclusive or" operation. The operation can identify error events between the candidate sequences and the logic states. At step 410, candidate sequences of bits can be reduced based on the comparison. Branch metric calculations are then made at step 412 for the remaining paths. At step 414, the most likely path is selected by the channel detector 300 based on the branch metric calculations.

Figure 5:
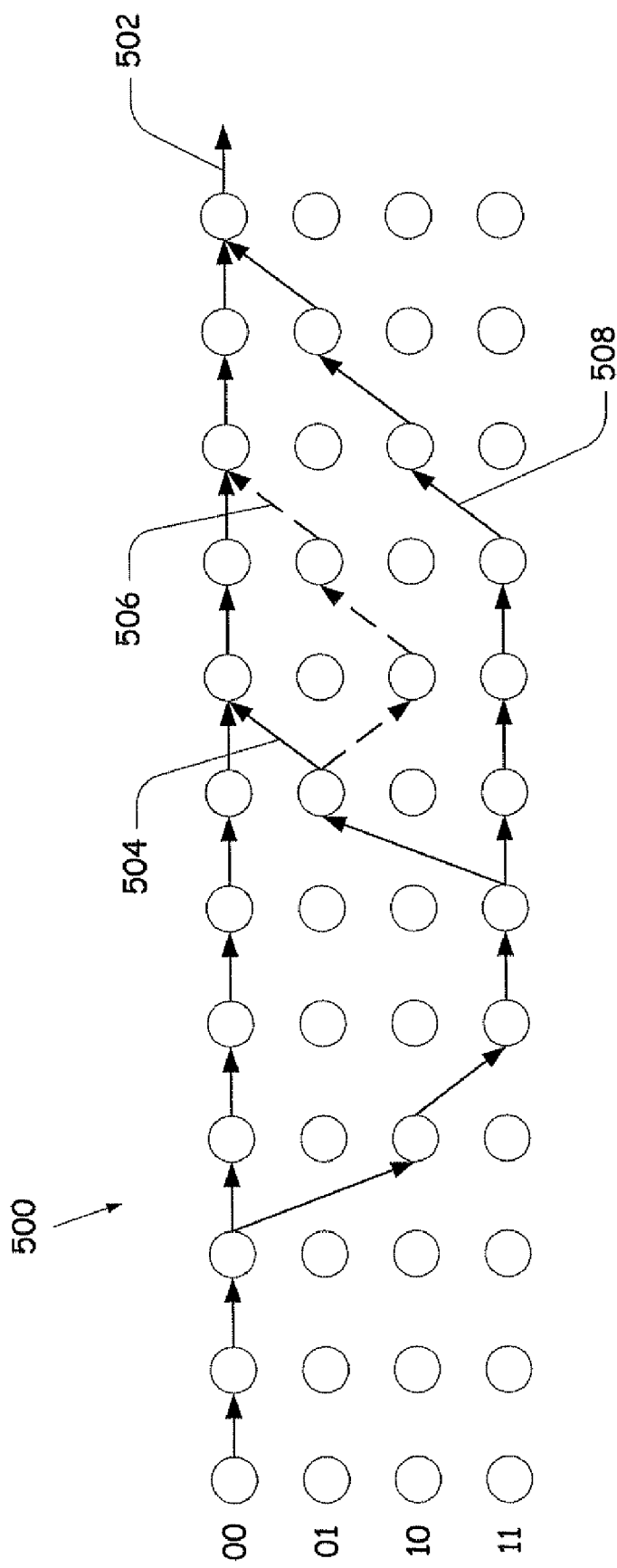
FIG. 5 is a diagram of a trellis used in reducing candidate sequences of bits.

FIG. 5 is a diagram of an exemplary trellis 500 that illustrates the reduction of candidate sequences provided in FIGS. 3 and 4. Trellis 500 includes states "00", "01", "10", and "11". A primary path 502 corresponds to the decision of logic states of bits based on reliability information provided in step 406 of FIG. 4. Additionally, trellis 500 includes a plurality of error paths 504, 506 and 508 that correspond to the comparison between the candidate sequences and the logic states provided in step 408 of FIG. 4. Error paths 504, 506 and 508 include an error event in the fourth bit. In certain communication channels, for example, magnetic perpendicular recording channels, likely error events correspond to a {1} based on the exclusive or operation between candidate sequences and logic states in step 408. For example, the error events can be {1}, {1,1}, {1,1,1}, etc. Additionally, the separation between error events is greater than a certain number of bits. For example, the error event could be separated by greater than three bits, four bits, five bits, six bits, etc. In the example where separation of error events is greater than three bits, paths 504 and 508 are likely error events. However, path 506 is an unlikely path and can be reduced at step 410. The likely paths, namely paths 504 and 508 can be sent to a decoder to determine a best path. By reducing the unlikely error events, processing within channel detector 300 can be reduced. Some branch metric calculations can be avoided in order to provide a more efficient channel detector 300. For example, in a conventional 16-state SOVA detector, 32 branch metric calculations and 16 add-compare-selects would be needed to decode a signal. Using state reducer 304, the branch metric calculations can be reduced to 16 with 5 add-compare-selects and 6 additions. Thus, an improved detector can be provided.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the encoding/decoding system while maintaining substantially the same functionality without departing from the scope and spirit of the present invention. In addition, although the embodiment described herein is directed to a SOVA detector, it will be appreciated by those skilled in the art that the teachings of the present invention can be applied to other "soft" output detectors without departing from the scope and spirit of the present invention. Also, the terms "de-interleaver" and "interleaver" as used in the specification and claims are interchangeable.

What is claimed is:

1. A detector comprising:
   a path generator adapted to produce a plurality of candidate sequences of bits and decisions regarding logic states of detected bits in a signal based on reliability information for the logic states;
   a state reducer adapted to:
      compare the plurality of candidate sequences of bits and the decisions to identify unlikely error events; and
      discard at least one candidate sequence based on an unlikely error event to produce a set of remaining paths; and
   a branch metric calculator adapted to calculate metrics for the set of remaining paths.

2. The detector of claim 1 and further comprising:
   an add-compare-select unit for selecting one of the remaining paths based on the metrics.

3. The detector of claim 1 wherein the state reducer is further adapted to:
   identify likely and unlikely error events based on the comparison of the plurality of sequences of bits and the decisions; and
   discard the unlikely error events to produce the set of remaining paths.

4. The detector of claim 3 wherein likely error events are events in the comparison that are separated by at least three bits.

5. The detector of claim 4 wherein likely error events are events in the comparison that are separated by at least five bits.

6. The detector of claim 1 wherein the reliability information is determined using a soft output viterbi algorithm.

7. The detector of claim 1 wherein the detector is part of a communications channel within a data storage device and the detector is configured to detect bits from a data storage medium.

8. A method comprising:
   processing in a channel detector circuit comprising:
      detecting bits in a signal and generating a plurality of candidate sequences of bits therefrom;
      determining reliability information regarding logic states of detected bits in the signal;
      generating decisions regarding the logic states based on the reliability information;

comparing the decisions and the plurality of candidate sequences to identify unlikely error events;

discarding at least one of the plurality of candidate sequences based on the unlikely error events to form a set of remaining candidate sequences; and performing a branch metric calculation on the set of remaining candidate sequences.

9. The method of claim 8, wherein processing in the channel detector circuit further comprises: selecting a most likely path from the set of remaining candidate sequences based on the branch metric calculation.

10. The method of claim 8, wherein processing in the channel detector circuit further comprises: identifying likely and unlikely error events based on the comparison of the plurality of sequences of bits and the decisions and discarding the unlikely error events.

11. The method of claim 10 wherein likely error events are events in the comparison that are separated by at least three bits.

12. The method of claim 11 wherein likely error events are events in the comparison that are separated by at least five bits.

13. The method of claim 8 wherein the reliability information is determined using a soft output viterbi algorithm.

14. The method of claim 8 wherein the channel detector circuit is part of a communications channel within a data storage device and the detector is configured to detect bits from a data storage medium.

15. A communications channel, comprising:
a channel medium;
a channel detector adapted to receive a signal from the channel medium, the channel detector comprising:

a path generator adapted to produce a plurality of candidate sequences of bits and decisions regarding logic states of detected bits in the signal based on reliability information for the logic states;

a state reducer adapted to:
compare the plurality of candidate sequences of bits and the decisions to identify unlikely error events;
discard at least one candidate sequence based on an unlikely error event to produce a set of remaining paths; and a branch metric calculator adapted to calculate metrics for the set of remaining paths.

16. The channel of claim 15 wherein the channel detector further includes an add-compare-select unit for selecting one of the remaining paths as a most likely path based on the metrics.

17. The channel of claim 15 wherein the state reducer is further adapted to:
identify likely and unlikely error events based on the comparison of the plurality of candidate sequences of bits and the decisions; and
discard candidate sequences associated with unlikely error events to produce the set of remaining paths.

18. The channel of claim 17 wherein likely error events are events in the comparison that are separated by at least three bits.

19. The channel of claim 18 wherein likely error events are events in the comparison that are separated by at least five bits.

20. The channel of claim 15 wherein the reliability information is determined using a soft output viterbi algorithm.

* * * * *